United States Patent [19]

Grabbe et al.

[11] Patent Number: 4,684,184
[45] Date of Patent: Aug. 4, 1987

[54] CHIP CARRIER AND CARRIER SOCKET FOR CLOSELY SPACED CONTACTS

[75] Inventors: Dimitry G. Grabbe, Middletown; Iosif Korsunsky, Harrisburg, both of Pa.

[73] Assignee: AMP Incorporated, Harrisburg, Pa.

[21] Appl. No.: 818,831

[22] Filed: Jan. 14, 1986

[51] Int. Cl.$^4$ ............................................. H01R 23/72
[52] U.S. Cl. ........................................ 439/64; 439/68
[58] Field of Search .............. 339/174, 186 M, 17 CF, 339/17 M, 17 MP; 174/52 FP; 361/400, 403, 406

[56] References Cited

U.S. PATENT DOCUMENTS

| 3,950,059 | 4/1976 | Anhalt et al. | 339/186 M |
|---|---|---|---|
| 4,502,747 | 3/1985 | Bright et al. | 339/17 CF |
| 4,530,552 | 7/1985 | Meehan et al. | 339/17 CF |

FOREIGN PATENT DOCUMENTS

| 1152765 | 5/1969 | United Kingdom | 339/17 CF |
|---|---|---|---|
| 2107136 | 4/1983 | United Kingdom | 339/17 CF |

Primary Examiner—Neil Abrams
Attorney, Agent, or Firm—F. W. Raring; B. J. Wolstoncroft

[57] ABSTRACT

Chip carrier comprising a square chip carrier body as slots extending inwardly from its side surfaces midway between its corners. These slots function as keyways for keys that are contained in the chip carrier socket. The keys are located midway between the corners of the chip carrier receiving recess and each key is in the row of contact terminals which are positioned in the socket body in surrounding relationship to the recess. By virtue of this system of positioning the chip carrier in the chip carrier socket, the effects of differential thermal expansion of the chip carrier relative to the chip carrier socket are minimized.

14 Claims, 12 Drawing Figures

CHIP CARRIER AND CARRIER SOCKET FOR CLOSELY SPACED CONTACTS

FIELD OF THE INVENTION

This invention relates to integrated circuit chip carriers of the type comprising a chip carrier body having contact zones thereon and chip carrier sockets which receive chip carriers and serve to connect the contact zones to other conductors such as terminal pads on a circuit board. The invention is particularly concerned with problems of differential thermal expansion of the chip carrier and the chip carrier socket which can lead to loss of electrical contact between the contact zones of the chip carrier and the contact terminals in the chip carrier socket.

BACKGROUND OF THE INVENTION

Integrated circuit chips and similar devices are commonly mounted or "packaged" in or on insulating bodies of ceramic or plastic and the terminal areas of the chip are connected to conductors on or in the insulating body. These conductors extend to the edge portions of the chip carrier body and have contact zones on their ends. Electrical connections are made to these contact zones by means of a chip carrier socket which has a recess which receives the chip carrier and which has contact terminals therein which engage the contact zones of the chip carrier. The terminals in the chip carrier socket in turn are connected to other conductors such as conductors on a ceramic substrate or a circuit board when the socket is mounted on the substrate.

The majority of all chip carriers are manufactured in accordance with an industry-wide standard referred to as the JEDEC Standard which was issued and is maintained by the Electronics Industries Association of 2001 Eye Street, N.W., Washington, D.C. 20006. This standard sets forth specifications for the dimensions of the chip carrier body, the locations of the contact zones on the chip carrier, and the manner in which the chip carrier will be precisely positioned in the chip carrier socket so that any manufacturer can produce sockets or chip carriers which can be interchanged by an equipment manufacturer. In accordance with the JEDEC Standard, the chip carrier body is square and has one beveled corner and three notched corners. The chip carrier socket has a spring device which bears against the beveled corner of the chip carrier body and urges the corner which is opposite to the beveled corner against a pin on the socket body. The pin is seated in the notch at that corner. Pins are also provided for the remaining two notched corners of the chip carrier body with some clearance in these remaining two corners so that some differential thermal expansion can take place when the chip carrier and socket are placed in service.

The system described above of using a spring and locating pins on the socket for locating the chip carrier is satisfactory if the contact zones on the chip carrier are located on centers spaced apart by about 0.020 inches (0.51 mm). However, if the contact zones are spaced apart by only 0.010 inches (0.25 mm), contact between the contact zones of the chip carrier and the terminals of the socket may be lost if there is differential thermal expansion of the chip carrier relative to the socket. This loss of contact would result from the fact that one corner of the chip carrier is fixed by virtue of the locating pin which is snugly seated in the notch of that one corner and if the chip carrier should undergo thermal expansion to a different extent than the chip carrier socket, the contact zones of the chip carrier may be moved away from the contact terminals of the chip carrier socket. The present invention is directed to the achievement of an improved locating system for chip carriers and chip carrier sockets which will greatly reduce the effects of differential thermal expansion and thereby eliminate the possiblity of loss of electrical continuity. The JEDEC standard is inadequate for an emerging generation of chip carriers having contact zones on very closely spaced centers; the chip carrier and socket of the present invention will satisfy the requirements of this new generation.

THE INVENTION

The invention comprises a chip carrier socket and an integrated circuit chip carrier. The chip carrier comprises a rectangular chip carrier body having oppositely facing major surfaces, four laterally facing peripheral carrier body side surfaces which extend normally of the carrier body major surfaces, and a plurality of chip carrier contact zones on the chip carrier body adjacent to the peripheral side surfaces. The chip carrier socket comprises a socket body having oppositely facing first and second major surfaces and laterally facing socket body side surfaces. A rectangular chip carrier receiving recess extends into the first major surface for reception of the chip carrier body, the recess having four recess side surfaces which extend inwardly from the first major surface. Contact terminals are provided in the socket body in surrounding relationship to the recess, the contact terminals being engageable with the chip carrier contact zones upon placement of the chip carrier in the recess. The chip carrier socket and the chip carrier are characterized in that each of the peripheral side surfaces and each of the recess side surfaces has locating means for locating the chip carrier in the recess. Each locating means comprises a keyway slot extending into the peripheral side surface of the chip carrier body and a key in the chip carrier socket, the keys and the keyway slots being located midway between the corners of the chip carrier receiving recess and the chip carrier body respectively.

In accordance with further aspects of the invention, the contact terminals are flat stamped complanate terminals, the terminals being in stacked side-by-side relationship in rows which extend along each of the recess side surfaces, adjacent terminals in each row having their major rolled surfaces opposed to each other.

THE DISCLOSED EMBODIMENT

Figure 1:
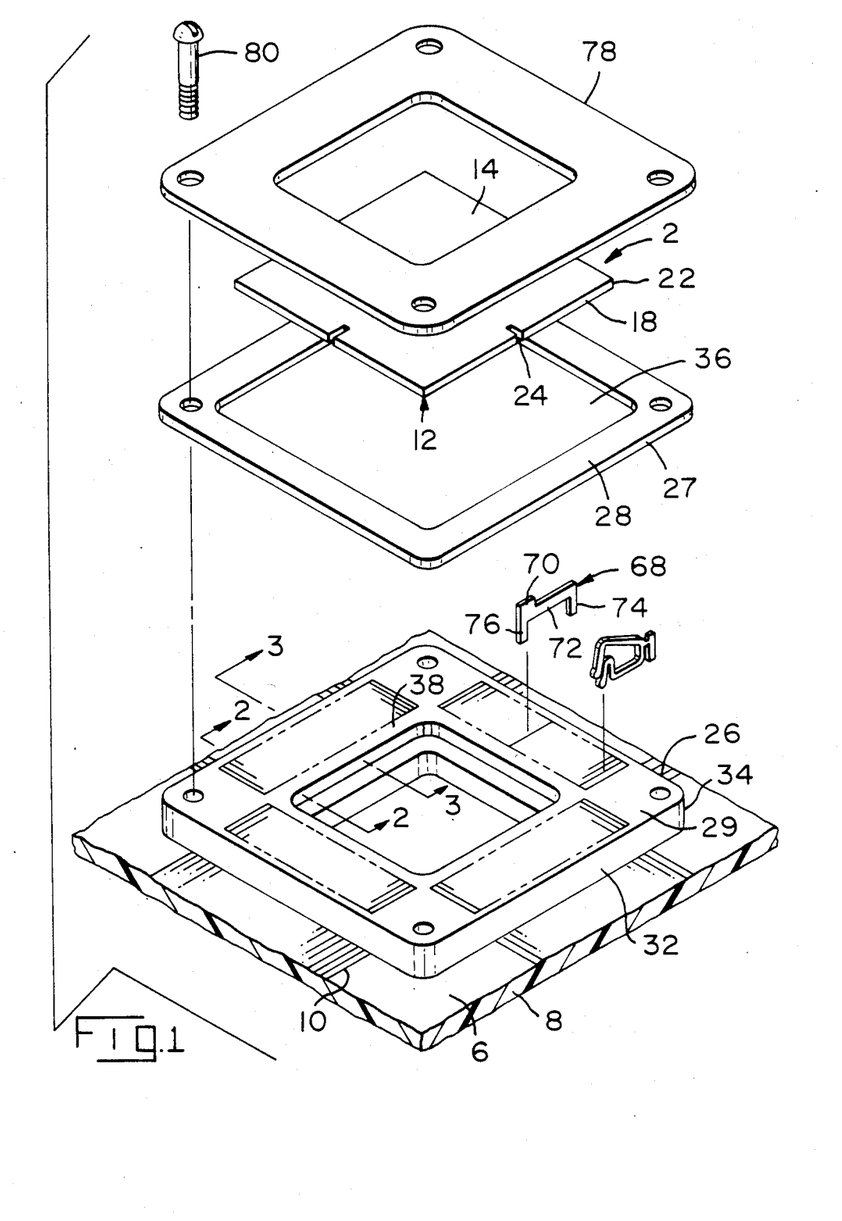
FIG. 1 is a perspective view showing a chip carrier and a chip carrier socket with the parts exploded from each other, the body portion of the socket being mounted on a substrate.
Figure 2:
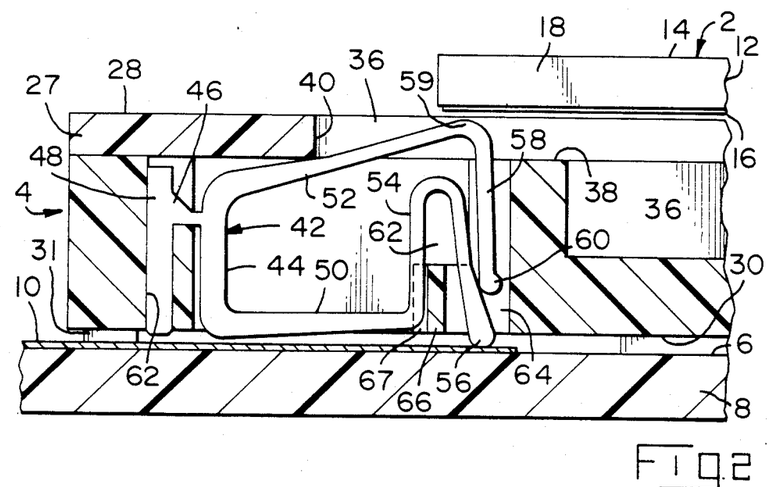
FIG. 2 is a view looking in the direction of the arrows 2—2 of FIG. 1 but with the chip carrier adjacent to the upper surface of the carrier socket assembly.

FIGS. 1 and 2 show a chip carrier 2 and a chip carrier socket in accordance with the invention. The chip carrier socket 4 is mounted on the upper surface 6 of a substrate 8 on which there are conductors 10. The chip carrier 2 comprises a square chip carrier body 12 having upper and lower major surfaces 14, 16, and peripheral side surfaces 18. Spaced-apart contact zones 20 are provided on the surface 16 (FIG. 5) and are arranged in rows extending between the corners 22 of the chip carrier body. Midway between each of the corners a keyway slot or notch 24 is provided for positioning the chip carrier in the chip carrier socket.

The socket 4 comprises a socket housing assembly which is made up of a main body portion 26 and a cover 27 and a clamping plate 78. The socket assembly therefore has an upper or first surface 28 and a lower or second surface 30, the cover member being against the upper surface 29 of the body portion 26. The socket body has outwardly facing side surfaces 32 and corners 34.

A square chip carrier receiving recess 36 is provided in the upper surface 28 and is defined by the cover member 27 which has an enlarged central opening. The main body portion 26 has supporting surfaces as shown at 38 for the central portions of the chip carrier 2 and the recess 36 has recess side surfaces 40 which extend normally of the upper major surface 28.

Figure 3:
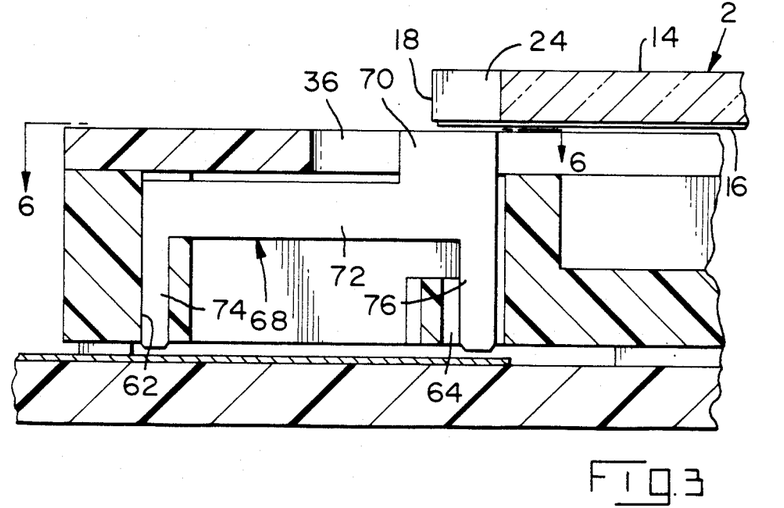
FIG. 3 is a view similar to FIG. 2 looking in the direction of the arrows 3—3 of FIG. 1.

Contact terminals 42 are contained in terminal-receiving cavities which surround the recess 36, the terminals being of the general type described in U.S. Pat. No. 4,511,197, which is hereby incorporated by reference. The terminals are flat, stamped sheet metal members having the two oppositely facing major side surfaces corresponding to the major rolled surfaces of the sheet metal. Each terminal has a yoke portion 44, a support 48 which is connected to the yoke by a connecting neck 46, and contact arms or beams 50, 52 which extend from the yoke 44. The lower arm 50 has a U-shaped portion 54 on its end which extends upwardly and then downwardly into a recess 64 as will be explained below. The end 56 of this U-shaped portion bears against a conductor 10 on the upper surface 6 of the circuit board 8.

The arm 52 extends diagonally from the yoke into the recess 36 and is reversely turned at 59 so that it has an end portion which also extends into the recess 64. The extreme end 60 of the portion 58 bears against the edge of the portion 56 of the arm 50 thereby to establish a relatively straight electrical path extending from a contact zone on the underside of the chip carrier directly to the conductor on the circuit board. Contact is made in the vicinity of the reverse bend 59. It should be mentioned that these contacts are stamped members and the reverse turns are not produced by bending but are in the contact terminal in its as stamped condition. The contact terminals 42 are contained in their positions by cavities provided in the body portion of the housing. Each cavity includes a vertical passageway 62 which receives the integral support 48 of a terminal and a notch 67 is provided in a barrier wall 66 which receives a portion of the U-shaped section 54 of arm 50.

The chip carrier 2 is precisely located in the recess 36 by means of keying members 68 which are also flat, stamped sheet metal devices which may have the same thickness as the terminals 42. Each key member 68 a keying ear 70, FIG. 3, which is received in one of the keying slots or notches 24 and which extends from a horizontal yoke portion 72. Legs 74, 76 extend downwardly from this yoke and are received in the passageways 62, 64 as shown in FIG. 3.

Figure 4:
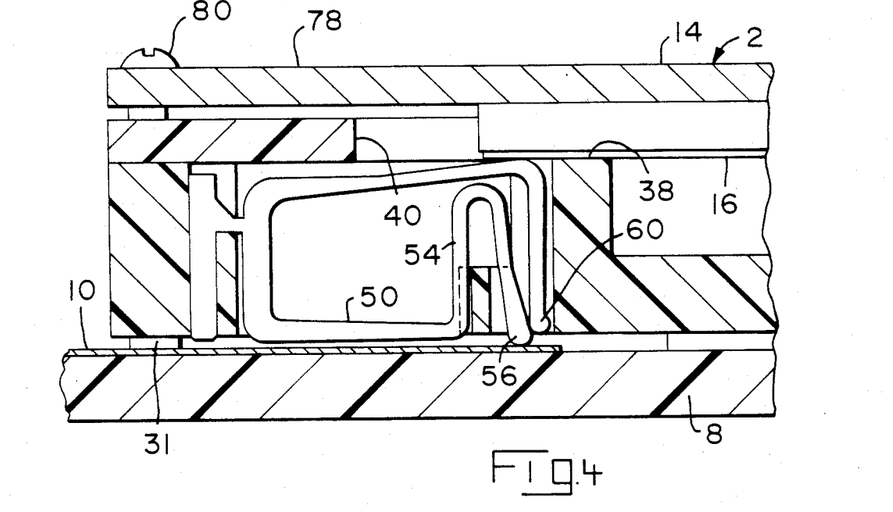
FIG. 4 is a view similar to FIG. 2 but showing all of the parts, including the cover member, assembled to each other.

When all the parts are assembled to each other, the chip carrier 2 is maintained in the recess 36 by a clamping plate 78 which bears against the upper major surface of the chip carrier as shown in FIG. 4 and which is held to the chip carrier socket by fasteners 80 which extends through the chip carrier socket at the corners thereof and are threaded into the circuit board. As shown in FIG. 4, short standoff projections 31 are provided to maintain the lower surface of the chip carrier socket above the surface of the circuit board.

Figure 7:
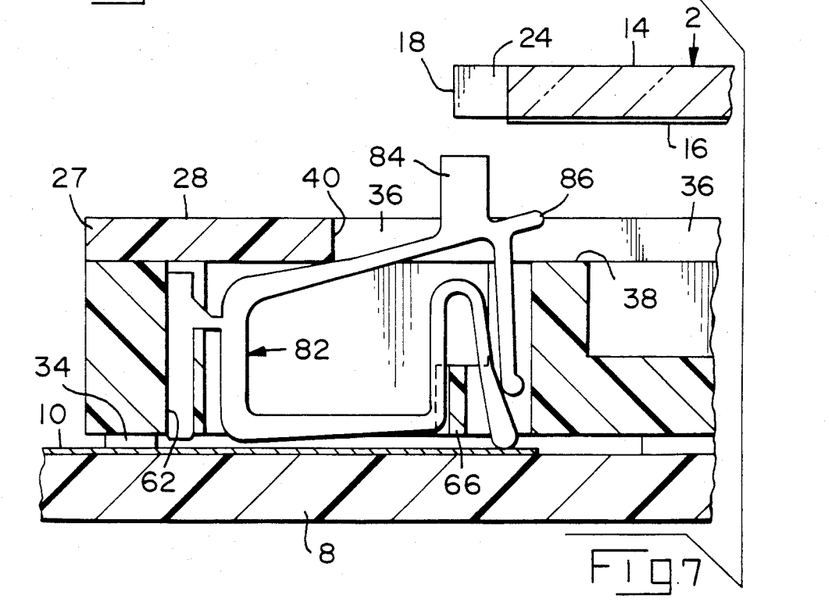
FIG. 7 is a view similar to FIG. 3 showing an alternative embodiment of the invention.

FIG. 7 shows an alternative embodiment in which the keying member 82 also serves as an electrical contact terminal. The terminal 82 has a projection 86 which bears against a contact zone on the underside of the chip carrier and the terminal also has an upwardly projecting keying ear 84 which is received in one of the keyway slots or notches 24. If this type of terminal is used, it is unnecessary to sacrifice one of the contact positions on the chip carrier in order to accommodate a key as shown in FIG. 3 which does not perform an electrical function.

Figure 5:
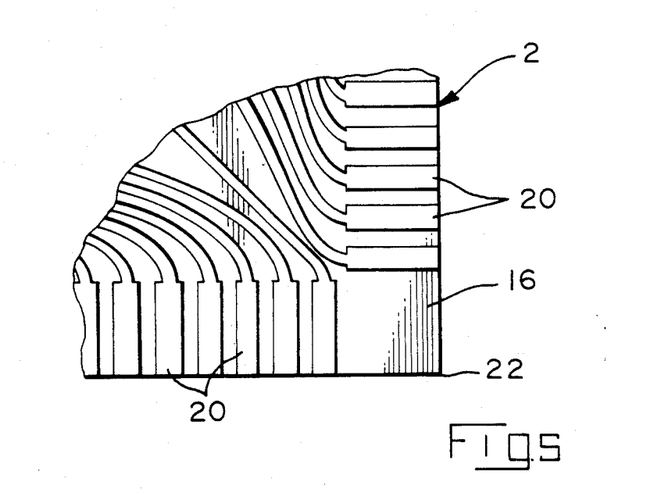
FIG. 5 is a fragmentary plan view of a corner portion of the underside of the chip carrier.
Figure 6:
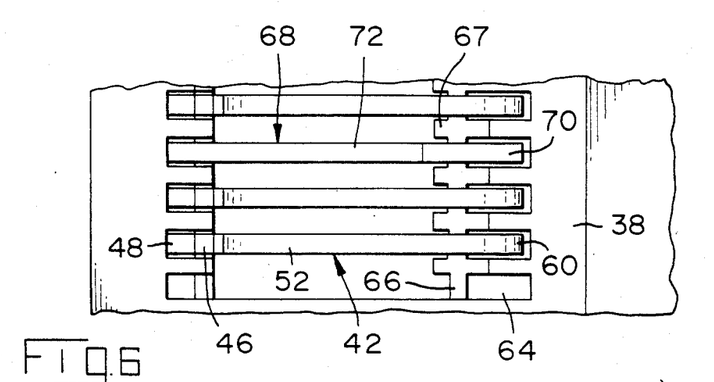
FIG. 6 is a fragmentary view looking in the direction of the arrows 6—6 of FIG. 3.

As noted above, the invention is particularly advantageous if the contact zones 20 on the chip carrier and the contact terminals in the chip carrier socket are extremely close together. Previously, it has been common practice to design chip carriers having contact zones on centers which are spaced apart by 0.02 inches (0.5 mm). However, it is now being proposed that the contact zones 20 as shown in FIG. 5 have a center-to-center spacing of 0.010 inches (0.25 mm) with the contact terminals having a thickness of only 0.005 inches (0.12 mm).

If the chip carrier and the chip carrier socket are made to these dimensional standards, the chip carrier must have accurately located notches therein and this can be done by forming the notches after the contact zones and the conductors are formed on the chip carrier. For example, if the chip carrier has a ceramic body, the notches are best produced by laser cutting or grinding after the chip carrier body has been fired or sintered and the conductors and contact zones have been produced by plating on the surface 16 of the chip carrier 2. Cutting of the notches after the sintering operation has been carried out is desirable in that it avoids the development of internal stresses in the chip carrier body which would lead to cracking if the notches were formed before firing or sintering. The terminals as noted above are flat, stamped members and are extremely thin, 0.12 mm, and the key has the same thickness as one of the terminals or in the case of the embodiment of FIG. 7, the key member is on one of the terminals.

The location of the notches is determined by optical methods. After the contact zones are produced on the surface of the chip carrier body, the centerline of each notch is determined by measuring the distance between the contact zones on each side of the notch location and grinding or laser cutting the notch on the basis of the measurement. This procedure is required for the reason that the actual widths of the contact zones will vary when they are produced by electroplating or etching and the notch must be precisely located between the adjacent zones. The need for these extraordinary measures can be appreciated if it is recalled that the center-to-center spacing is only 0.010 inches and the terminals have thickness of only 0.005 inches.

Figure 10:
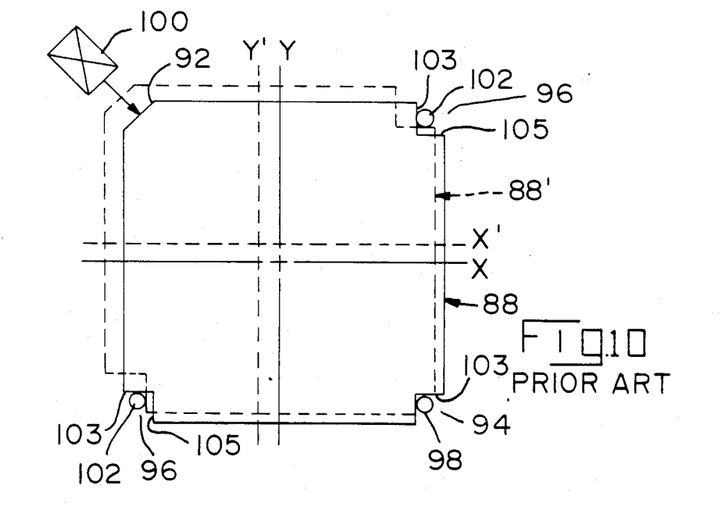
FIG. 10 is a diagrammatic plan view showing a chip carrier in accordance with the prior art JEDEC Standard and showing the elements of the socket which position the chip carrier; the dotted line positions show the outline of the chip carrier after thermal expansion has taken place.
Figure 11:
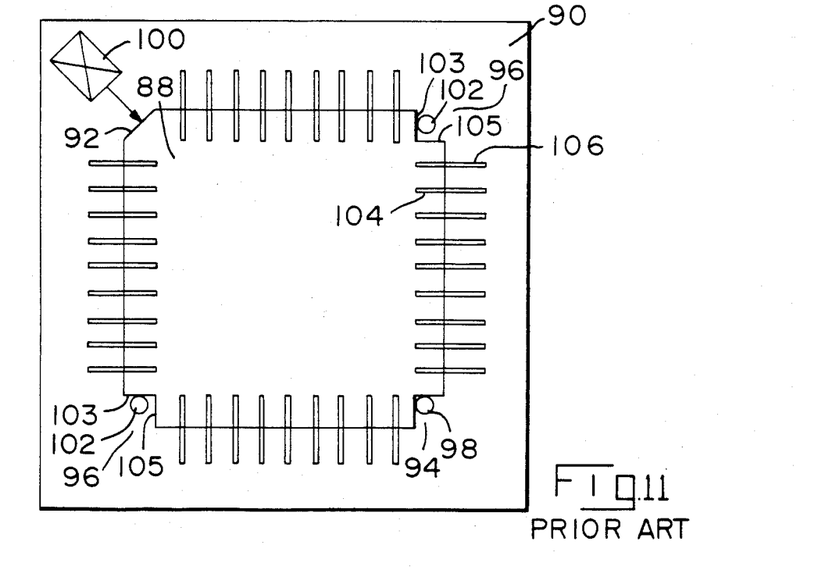
FIG. 11 is a view similar to FIG. 8 showing a prior art chip carrier positioned in a chip carrier socket.
Figure 12:
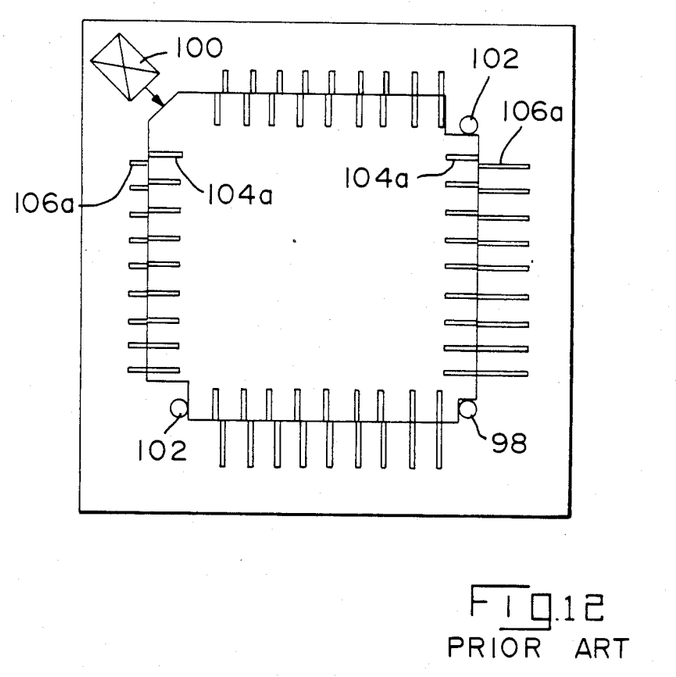
FIG. 12 is a view similar to FIG. 11 illustrating the effects of differential thermal expansion.

As mentioned previously, the invention has particular advantages in that the effects of differential thermal expansion of the chip carrier and the chip carrier socket are minimized. This feature of the invention can best be appreciated from a consideration of the prior art method of positioning chip carriers in sockets as shown in FIGS. 10–12. These figures are highly diagrammatic and do not purport to show actual parts, although the essential features of a known type of chip carrier are shown diagrammatically.

A standard JEDEC chip carrier 88, FIG. 10, comprises a square chip carrier body having one beveled corner 92 and notches 94, 96 at the remaining three corners. The notch 94 is diametrically opposed to the beveled corner 92 and the remaining notches 96 are between the corner 94 and the corner 92. The chip carrier socket 90 is provided with a spring member as shown at 100 which applies a biasing force against the beveled corner 92 so that the chip carrier body is pushed against the locating pin 98 on this socket. The pin 98 is snugly seated in the notch 94 and the chip carrier cannot move relative to this corner. Additional locating pins 102 are provided which are received in the corner notches 96, however, they are not snugly seated at the intersections of the sides 103, 105 of these notches but are rather against the sides 103 of the notches.

The chip carrier 88 is shown in its normal position in the solid line of FIG. 10 but if it undergoes thermal expansion, it will enlarge and occupy the dotted line position 88' so that the beveled corner will cause some compression of the spring 100. Also, the sides 105 will move towards the pins 102 when thermal expansion takes place as shown in FIG. 10. Finally, it should be noted that the geometric center of the chip carrier 88 will shift towards the beveled corner 92 as indicated in FIG. 10 when thermal expansion takes place from the solid line x-y axes to the dotted line x-y axes.

The problems which can arise with this prior art system are illustrated in FIGS. 11 and 12. FIG. 11 shows the chip carrier 88 and the socket 90 in their normal positions, and it is assumed that they are at the same temperature and that the contact zones 104 on the chip carrier 88 are precisely aligned with the terminals 106 of the socket 90. If, however, the chip carrier 88 undergoes a temperature rise and the socket 90 does not undergo a compensating temperature rise, the position of the chip carrier on the socket will change as shown in FIG. 12. In other words, the chip carrier in FIG. 12 corresponds to the dotted line position of the chip carrier as shown in FIG. 10. Because of the increase in the linear dimensions of the chip carrier, the contact zones 104 of the chip carrier are moved relative to the contact terminals 106 in the chip carrier socket and they will be displaced from the socket terminals to varying extents, depending upon the positions of the contact zones and the terminals. As shown in FIG. 12, the contact zones indicated at 104a have been significantly displaced as a result of thermal expansion from their associated socket contacts 106a. Those contact zones 104 and 106 which are immediately adjacent to the fixed positioning pin 98 are not seriously effected. However, the contact zones on the chip carrier which are remote from the corner notch 94 are seriously effected and may be shifted to the extent that they lose contact with their associated terminals 106a.

The fact that the condition shown in FIG. 12 can come about will be apparent if it is recalled that the terminals have a thickness of only 0.005 inches and that misalignment between the terminal and the contact zone of only 0.001 inches amounts to 20 percent of the terminal thickness. Also, ordinary manufacturing tolerances must be taken into consideration and such tolerances will also contribute to misalignments.

Figure 8:
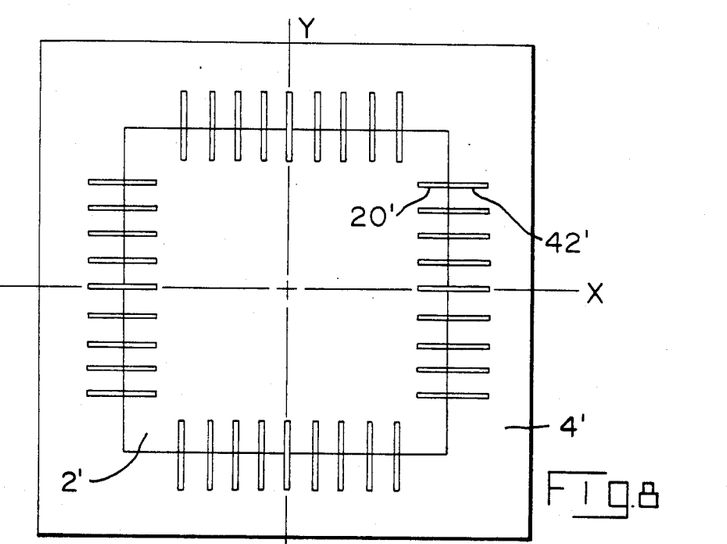
FIG. 8 is a diagrammatic plan view showing the chip carrier contained in the chip carrier socket, this view showing the positions of the parts when the chip carrier and the socket are at the same temperature and no different thermal expansion has taken place.
Figure 9:
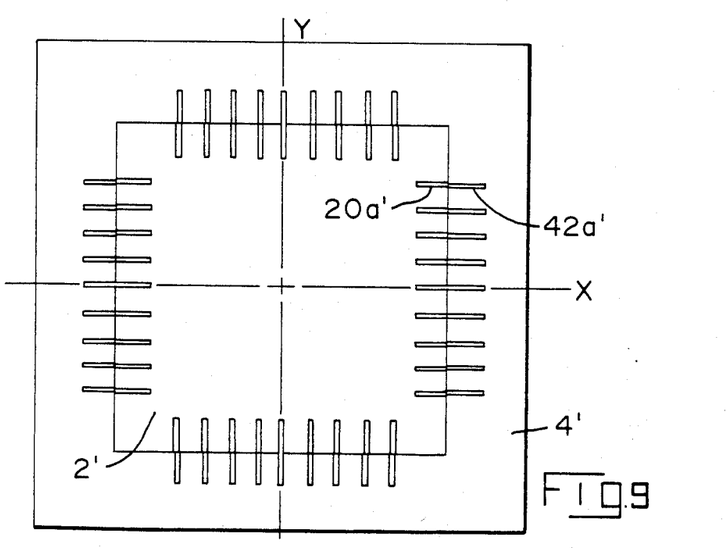
FIG. 9 is a view similar to FIG. 8 showing the effects of differential thermal expansion of the chip carrier relative to the chip carrier socket.

The problem illustrated in FIGS. 10–12 is very significantly reduced if the chip carrier and the chip carrier socket are constructed in accordance with the instant invention as shown by FIGS. 8 and 9. FIG. 8 shows the positions of the chip carrier and the chip carrier socket when the parts are at the same temperature and the contact zones 20' are in precise alignment with the contact terminals 42' of the chip carrier socket. The keys and keyways slots are indicated in FIG. 8 and the X and Y axes are shown as passing through the keys and keyway slots.

If the chip carrier 2' should undergo a temperature rise causing it to expand which is not matched by a similar temperature rise in the chip carrier socket, the conditions shown in FIG. 9 will obtain. The chip carrier must thermally expand in response to the temperature rise, however, the amount by which the contact zones are shifted relative to the contact terminals 42a' is greatly reduced. Those contact zones and contact terminals which are nearest to the X axis and the Y axis in FIGS. 8 and 9 will undergo very little displacement as a result of thermal expansion and the maximum amount of displacement of the contact zones 28' will take place in those contact zones which are most remote from the X axis and the Y axis. However, since the chip carrier is located on the X and Y axes, the maximum displacement which takes place in those contact zones closest to the corners of the chip carrier is only one-half of the maximum displacement encountered in FIG. 12. This significant reduction in the thermal displacement of the contact zones then makes possible the use of contact terminals in the chip carrier which are on 0.01 inch center lines and contact zones on the chip carrier which are also on 0.010 center lines.

It will be apparent from the foregoing that the effect of differential thermal expansion on chip carriers and the chip carrier sockets can be greatly reduced in accordance with the present invention and as a result, it becomes possible to place the contact zones and the contact terminals on closer center lines than has heretofore been practical.

We claim:

1. A chip carrier socket and an integrated circuit chip carrier, the chip carrier comprising a rectangular chip carrier body having oppositely facing major surfaces and four laterally facing peripheral carrier body side surfaces which extend normally of the carrier body major surfaces, a plurality of chip carrier contact zones on the chip carrier socket comprising a socket body having oppositely facing first and second major surfaces and laterally facing socket body side surfaces, a rectangular chip carrier receiving recess extending into the first major surface for reception of the chip carrier body, the recess having four recess side surfaces which extend inwardly from the first major surface, passages located in the socket body in surrounding relationship to the recess, contact terminals located in a plurality of the recesses, the contact terminals being engageable with the chip carrier contact zones upon placement of the chip carrier in the recess, the chip carrier socket and the chip carrier being characterized in that:

each side of the peripheral side surfaces and each of the recess side surfaces has locating means for precisely locating the chip carrier in the recess,     each locating means comprising a key slot extending into the peripheral side surface of the chip carrier body and a key means in the chip carrier socket, the key means and the key slots being located midway between the corners of the chip carrier receiving recess and the chip carrier body respectively,     each key means being positioned in a said respective passage, of the socket body, thereby allowing the locating means to be used in sockets having a wide range of terminal centerline spacing requirements, including very close centerline spacing, and     said key means and key slot being configured to interengage so that when the chip carrier undergoes thermal expansion relative to the socket, they provide four positions at which the chip carrier remains precisely and fixedly positioned in the socket so that each of said chip carrier side surfaces undergoes such thermal expansion substantially symmetrically about the key extending thereinto, thereby maintaining the terminals of the socket in electrical engagement with the contact areas of the chip carrier.

2. A chip carrier socket and an integrated circuit chip carrier as set forth in claim 1 characterized in that the contact terminals are stamped planar terminals, the terminals being in stacked side-by-side relationship in rows which extend along each of the recess side surfaces.

3. A chip carrier socket and an integrated circuit chip carrier as set forth in claim 2 characterized in that the socket has terminal locating surface portions along each of the recess side surfaces for locating the terminals, the keys being in terminal locating surface portions.

4. A chip carrier socket and an integrated circuit chip carrier as set forth in claim 3 characterized in that each key comprises a keying ear which is integral with one of the terminals.

5. A chip carrier socket and an integrated circuit chip carrier, the chip carrier comprising a flat chip carrier body having oppositely facing major surfaces and laterally facing peripheral carrier body side surface portions which extend normally of the carrier body major surfaces, a plurality of chip carrier contact zones on the chip carrier body adjacent to the peripheral side surface portions, the chip carrier socket comprising a socket body having oppositely facing first and second major surfaces and laterally facing socket body side surfaces, a chip carrier receiving recess extending into the first major surface for reception of the chip carrier body, the recess having recess side surface portions which extend inwardly from the first major surface, passages located in the socket body in surrounding relationship to the recess, contact terminals located in a plurality of the recesses, the contact terminals being engageable with the chip carrier contact zones upon placement of the chip carrier in the recess, the chip carrier socket and the chip carrier being characterized in that:

the chip carrier body and the recess have common X and Y axes of symmetry which lie in a plane which is parallel to the major surfaces of the chip carrier body and the major surfaces of the socket,     four locating means are provided for precisely locating the chip carrier in the recess, each locating means comprising a key slot in the chip carrier body extending inwardly from the peripheral carrier body side surface portions and a key means in respective passages of the socket which is received in the slot,     the locating means being on the X and Y axes of symmetry, and     said key means and key slot being configured to interengage so that when the chip carrier undergoes thermal expansion relative to the socket, they provide four positions at which the chip carrier remains precisely and fixedly positioned in the socket so that each of said chip carrier side surfaces undergoes such thermal expansion substantially symmetrically about the key means extending thereinto, thereby maintaining the terminals of the socket in electrical engagement with the contact areas of the chip carrier.

6. A chip carrier socket and a chip carrier as set forth in claim 5 characterized in that the locating means are at equal angular intervals in surrounding relationship to the center of the chip carrier body.

7. A chip carrier socket and a chip carrier as set forth in claim 6 characterized in that the chip carrier body is square, each of the keyway slots being midway between two corners of the chip carrier body.

8. A body carrier socket and an integrated circuit chip carrier as set forth in claim 7 characterized in that the contact terminals are stamped planar terminals, the terminals being in stacked side-by-side relationship in rows which extend along each of the recess side surfaces.

9. A chip carrier socket and an integrated circuit chip carrier as set forth in claim 7 characterized in that the socket has terminal locating surface portions along each of the recess side surfaces for locating the terminals, the keys being in terminal locating surface portions.

10. A chip carrier socket and a chip carrier as set forth in claim 8 characterized in that each key comprises a keying ear which is integral with one of the terminals.

11. A chip carrier socket and an integrated circuit chip carrier, the chip carrier comprising a rectangular chip carrier body having oppositely facing major surfaces and four laterally facing peripheral carrier body side surfaces which extend normally of the carrier body major surfaces, a pluarlity of chip carrier contact zones on the chip carrier socket comprising a socket body having oppositely facing first and second major surfaces and laterally facing socket body side surfaces, a rectangular chip carrier receiving recess extending into the first major surface for reception of the chip carrier body, the recess having four recess side surfaces which extend inwardly from the first major surface, passages located in the socket body in surrounding relationship to the recess, contact terminals located in a plurality of the recesses, the contact terminals being engageable with the chip carrier contact zones upon placement of the chip carrier in the recess, the chip carrier socket and the chip carrier being characterized in that:

each of the peripheral side surfaces and each of the recess side surfaces has locating means for precisely locating the chip carrier in the recess,     each locating means comprising a key slot extending into the peripheral side surface of the chip carrier body and a key means in the chip carrier socket, the key means and the key slots being located midway between the corners of the chip carrier receiving recess and the chip carrier body respectively, and     said key means and key slot being configured to interengage so that when the chip carrier undergoes thermal expansion relative to the socket, they provide four positions at which the chip carrier remains precisely and fixedly positioned in the socket so that each of said chip carrier side surfaces undergoes such thermal expansion substantially symmetrically about the key extending thereinto, thereby maintaining the terminals of the socket in electrical engagement with the contact areas of the chip carrier.

12. A chip carrier socket and an integrated circuit chip carrier as set forth in claim 11 characterized in that the contact terminals are stamped planar terminals, the terminals being in stacked side-by-side relationship in rows which extend along each of the recess side surfaces.

13. A chip carrier socket and an integrated circuit chip carrier as set forth in claim 12 characterized in that the socket has terminal locating surface portions along each of the recess side surfaces for locating the terminals, the keys being in terminal locating surface portions.

14. A chip carrier socket and an integrated circuit chip carrier as set forth in claim 13 characterized in that each key comprises a keying ear which is integral with one of the terminals.

* * * * *